United States Patent
Zesch et al.

(10) Patent No.: US 7,201,022 B2
(45) Date of Patent: Apr. 10, 2007

(54) SYSTEMS AND METHODS FOR FILLING VOIDS AND IMPROVING PROPERTIES OF POROUS THIN FILMS

(75) Inventors: James Charles Zesch, Santa Cruz, CA (US); Joost J. Vlassak, Cambridge, MA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 11/154,629

(22) Filed: Jun. 17, 2005

(65) Prior Publication Data

US 2005/0233264 A1    Oct. 20, 2005

Related U.S. Application Data

(62) Division of application No. 10/063,326, filed on Apr. 11, 2002.

(51) Int. Cl.
*B29C 65/00* (2006.01)
*B29C 67/00* (2006.01)

(52) U.S. Cl. .................. 65/17.2; 264/42; 264/46.4; 264/48; 264/621; 427/96.1; 427/96.2; 427/96.7; 427/97.3; 427/98.2; 427/98.4; 427/98.8; 65/40

(58) Field of Classification Search ................. 264/42, 264/46.4, 48, 621; 427/96.1, 96.2, 96.7, 427/97.3, 98.2, 98.4, 98.8; 65/17.2, 40; 428/304.4; 216/41
See application file for complete search history.

(56) References Cited

U.S. PATENT DOCUMENTS

| | | | | |
|---|---|---|---|---|
| 3,865,469 | A | * | 2/1975 | Asai et al. .................. 349/162 |
| 5,202,274 | A | * | 4/1993 | Bae et al. .................... 438/585 |
| 5,413,865 | A | * | 5/1995 | Nakamura et al. .......... 428/432 |
| 5,688,606 | A | | 11/1997 | Mahulikar et al. |
| 5,733,660 | A | * | 3/1998 | Makita et al. .............. 428/426 |
| 5,807,611 | A | | 9/1998 | Bearinger et al. |
| 5,925,228 | A | | 7/1999 | Panitz et al. |

* cited by examiner

*Primary Examiner*—Jennifer McNeil
*Assistant Examiner*—Aaron Austin
(74) *Attorney, Agent, or Firm*—Oliff & Berridge, PLC (57) ABSTRACT

Methods of reducing the intrusions or migrations of photolithography materials by introducing a sol-gel layer onto a porous thin film prior to applying the photolithography/photoresist material layer. Curing the sol-gel layer results in the sol-gel layer merging or unifying with the underlying porous thin film layer so that the combined sol-gel/thin layer exhibits substantially the same properties as the untreated porous thin film layer before the sol-gel was applied. As a result, a greater etching accuracy is achieved.

6 Claims, 6 Drawing Sheets

SYSTEMS AND METHODS FOR FILLING VOIDS AND IMPROVING PROPERTIES OF POROUS THIN FILMS

BACKGROUND

This is a Division of application Ser. No. 10/063,326 filed Apr. 11, 2002. The entire disclosure of the prior application is hereby incorporated by reference herein in its entirety.

This invention relates to reducing the porosity of porous thin films.

Substrates having thin films are used commonly in many applications. Thin films are deposited upon substrates used routinely, for instance, in integrated circuits. Likewise, substrates having thin films are used in a multitude of microelectro-mechanical devices. Substrates having thin films are also used in the semiconductor industry, where great precision in the patterns formed in, and/or locations of, the thin film formed upon the substrates is necessary. The specific patterning and/or positioning of the thin film formed upon a substrate is typically achieved by controllably etching away the thin film material from the substrate using a photoresist mask, such that the thin film material remains in only those areas covered by the photoresist mask.

Figure 1:
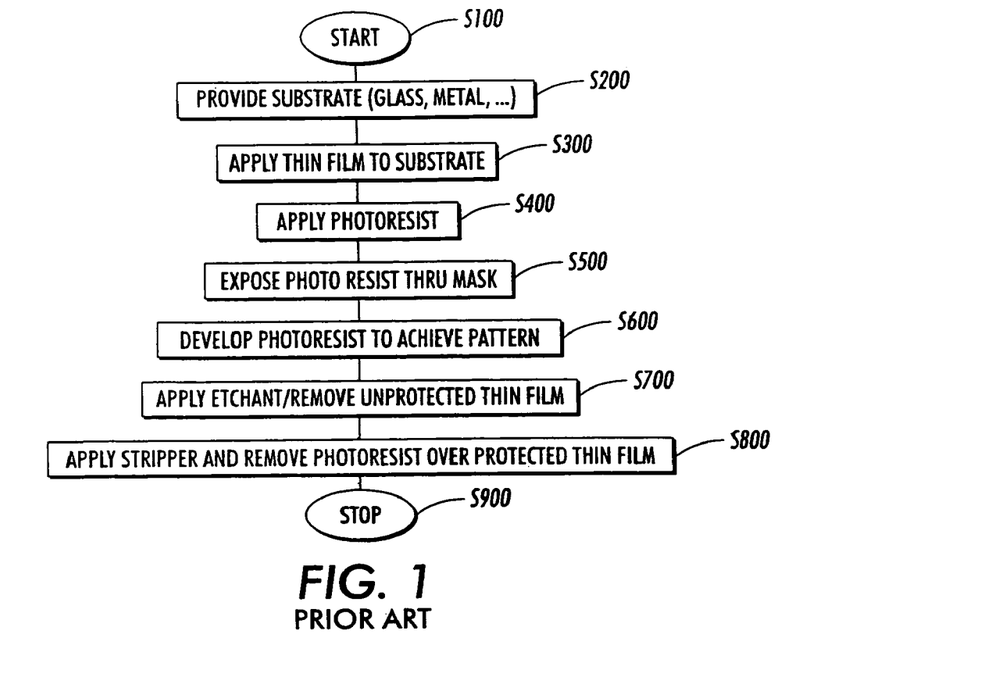
FIG. 1 is a flowchart illustrating a conventional method for depositing a thin film on a substrate.

FIG. 1 shows steps corresponding to earlier methods of depositing thin films on substrates. The substrate may be any known or later-developed suitable material, such as glass, metal, or the like. In general, the substrate material will be appropriate for the application the thin film device will be used with. The thin film is formed by sputtering a layer of material used to form the thin film onto the substrate, applying a layer of photoresist materials over the sputtered thin film layer, masking and developing the photoresist material layer to a desired pattern, and then etching away the unwanted photoresist materials and portions of the thin film layer to achieve the desired pattern in the thin film. Often, the resulting thin film layer tends to be porous. That is, the thin film will have voids, pores, holes, cracks and/or other surface penetrating defects.

Porosity in sputtered thin films is a common occurrence. Such porosity in sputtered thin films contributes to problems, such as photoresist intrusions, that render subsequent photolithography difficult. Porosity in sputtered thin films also contributes to lateral etchant intrusions into sidewalls of a thin film, thus rendering subsequent thin film etching difficult with respect to the precision required in thin films. Likewise, porosity in sputtered thin films results in a decreased mechanical thin film strength. Because of the weakened nature of the thin film, wire-bonding becomes difficult or unreliable. Further, porosity in sputtered thin films results in a lack of lateral film cohesion, which unfavorably compromises the physical properties of the thin film. For example, the transverse electromechanical coupling co-efficient of a thin film may be compromised by the lack of lateral film cohesion that occurs in porous thin films.

After the thin film is deposited on the substrate, a photolithography/photoresist material layer is applied over the thin film layer. The photolithography/photoresist material layer is commonly formed by spin-casting the photolithography/photoresist material layer onto the thin film. Because the thin film has surface-penetrating defects, the photolithography/photoresist material penetrates into the porous thin film. The photolithography/photoresist material is then exposed through a mask to achieve a desired pattern of exposed/unexposed portions of the photolithography/photoresist material layer on the thin film.

Thereafter, the exposed, or unexposed, portion of the photolithography/photoresist material layer is washed away or otherwise removed to leave the desired pattern of photolithography/photoresist material layer on the thin film. An etchant to which the thin film, but not the photolithography/photoresist material layer, is sensitive is then applied to remove the portions of the thin film that are not protected by the photolithography/photoresist material layer. The remaining patterned photolithography/photoresist material layer is then removed, without damaging the underlying thin film to leave a patterned thin film layer.

While the above-described process is common, it also is inherently flawed in that the photoresist material, which is initially applied to the thin film and that penetrate the voids or pores of the porous thin film, is often not successfully completely removed in areas intended to be etched prior to etching the thin film. In this case, portions of the thin film that were not to be protected by the photolithography/photoresist material layer are not fully etched away by the etchant because some photoresist remains in the unintended areas. Alternatively, the voids or other surface penetrating defects can allow the etchant to penetrate under the patterned layer of the photolithography/photoresist material layer. In this case, portions of the thin film that were to be protected by the patterned layer of photolithography/photoresist material layer are nonetheless etched away. This results in the thin film pattern upon the substrate being not as accurate or precise as would be ideally provided by the patterned photolithography/photoresist material layer. Furthermore, any etchant that laterally intruded or migrated into unintended areas of the thin film may have weakened the thin film and substrate, and also results in a thin film pattern that is not as accurate or precise as desired.

SUMMARY OF THE INVENTION

This invention provides systems and methods that reduce the porosity of thin film materials.

This invention separately provides systems and methods for improving the quality of photoresist-patterned thin films.

This invention separately provides systems and methods that reduce the incursion of photolithography/photoresist material into thin films.

This invention separately provides systems and methods that reduce the ability of thin film etchants to intrude into thin films under patterned photoresist layers.

This invention separately provides systems and methods that coat and penetrate a thin film with a sol-gel preparation to yield the combinant sol-gel/thin film layer having physical properties substantially the same as the original untreated thin film only layer.

In various exemplary embodiments, the systems and methods of this invention result in a treated thin film that reduces the ability of the photolithography/photoresist materials to intrude into voids or other surface penetrating defects in the thin film. In various exemplary embodiments, the systems and methods of this invention additionally or alternatively provide a treated thin film that is better able to resist etchant migrations or intrusions into the thin film that would otherwise disrupt or destroy the desired thin film pattern on the substrate.

In various exemplary embodiments of the systems and methods of this invention, the treated thin film is formed by applying a sol-gel layer on the porous thin film after the porous thin film is formed on or over the substrate, but before the photolithography/photoresist materials are applied to the thin film. By applying the sol-gel to the porous thin film according to the systems and methods of this invention, the porous thin film can be solidified to remove many, if not all, of the various surface-penetrating defects. That is, the initially porous thin film and sol-gel combination forms a uniformly strong treated thin film layer. Generally, the sol-gel material, or a pre-cursor of the sol-gel material, is applied to the thin film in liquid form and then converted by post application processing, such as by baking or curing the sol-gel material onto the thin film. In general, the sol-gel material, and thus the treated thin film layer, will also have the same etch rates and the same co-efficient of thermal expansion as the original, untreated, porous thin film.

As a result, after the photolithography/photoresist materials have been applied and patterned according to the mask pattern, the etchant will more accurately remove the unprotected areas of the treated thin film relative to the protected areas of the treated thin film over which the photolithography/photoresist materials have been patterned. Migrations or intrusions of the photoresist materials and/or the etchant into the thin film are reduced. Finally, because the thin film and sol-gel have similar co-efficients of thermal expansion, the strength and durability of the substrate and thin film is increased as the voids, pores and/or other surface-penetrating defects are not as susceptible to cracking or otherwise failing under the force of energy transmission from the thin film to a counterpart device or under heating in subsequent processing steps.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the systems and methods of this invention will be described in detail with reference to the following figures, wherein.

DETAILED DESCRIPTION OF EXEMPLARY EMBODIMENTS

This invention is directed to reducing the porosity in porous thin films and improving the accuracy and quality of photoresist-patterned thin films. Altering conventional methods of making thin films by adding a sol-gel layer to the thin film layer prior to applying a photoresist material layer reduces the number of cracks or other surface defects in the thin film layer. Baking or curing the sol-gel layer after applying the sol-gel layer to the thin film layer results in the sol-gel and thin film layers substantially combining to form a single unified layer of similar properties. As a result, the combined sol-gel/thin film layer has, for example, a co-efficient of thermal expansion or an etch rate that is substantially the same as that of a continuous non-porous thin film of the same material, which the thin film ideally would have had without the sol-gel layer. Generally, the sol-gel material, or a precursor of the sol-gel material, is applied to the thin film in liquid form and then converted by post application processing such as baking or curing to form a unified sol-gel/thin film layer.

It should be appreciated, of course, that the application of a sol-gel layer to a porous thin film may be used in applications other than a photolithography/photoresist material etching application, which is set forth and described herein as an exemplary illustration only of some of the benefits and advantages of reducing the effects of porosity defects in a thin film layer by adding and combining the sol-gel layer with the thin film layer.

Other exemplary benefits and/or advantages of the combined sol-gel/thin film layer having reduced porosity defects include an increased mechanical integrity of the sol-gel/thin film layer. As a result, more uniform strength or stability exists in the sol-gel/thin film layer rendering wire bonding, for example, more reliable. For instance, the sol-gel/thin film layer provides greater mechanical strength than non-sol-gel treated thin films.

Further, the uniformity and lateral cohesion of the sol-gel/thin film layer renders a medium having substantially the same velocity of sound which improves the transmission reliability of acoustic sound waves through the sol-gel/thin film layer. Likewise, because of the lateral cohesion of the sol-gel/thin film layer, electro-mechanical properties of the sol-gel/thin film layer are less likely to be compromised than non-sol-gel treated thin films. Photoresist intrusions and/or lateral etchant intrusions are also reduced due to the application of the sol-gel layer upon the thin film layer.

Further, the sol-gel/thin film combinant layer will exhibit substantially the same coefficient of thermal expansion as the untreated thin film layer, while at the same time reducing the porosity defects that otherwise often occur in sputtered thin films as discussed above. Other benefits and advantages, such as the planarization of the thin film layer by the sol-gel, for example, may also result from the sol-gel/thin film layer of the invention.

FIG. 1 shows a flowchart outlining a conventional method for producing thin films on substrates. As shown in FIG. 1, after beginning the process in step S100, operation continues to step S200, where a substrate is provided. Then, in step S300, a thin film is deposited on or over the substrate. Next, in step S400, a photoresist material layer is applied over the thin film. Operation continues to step S500.

In step S500, the photoresist material layer is exposed through a mask. Next, in step S600, the photoresist material layer is developed. Masking and developing the photoresist material layer in steps S500 and S600 results in a patterned photoresist material layer. Then, in step S700, an etchant is applied to remove the thin film over which no remaining photoresist material layer remains. A stripper is subsequently applied in step S800 to remove the remaining patterned portion of the photoresist material layer over the thin film layer portion. Operation then continues to step S900, where the method ends.

Figure 2:
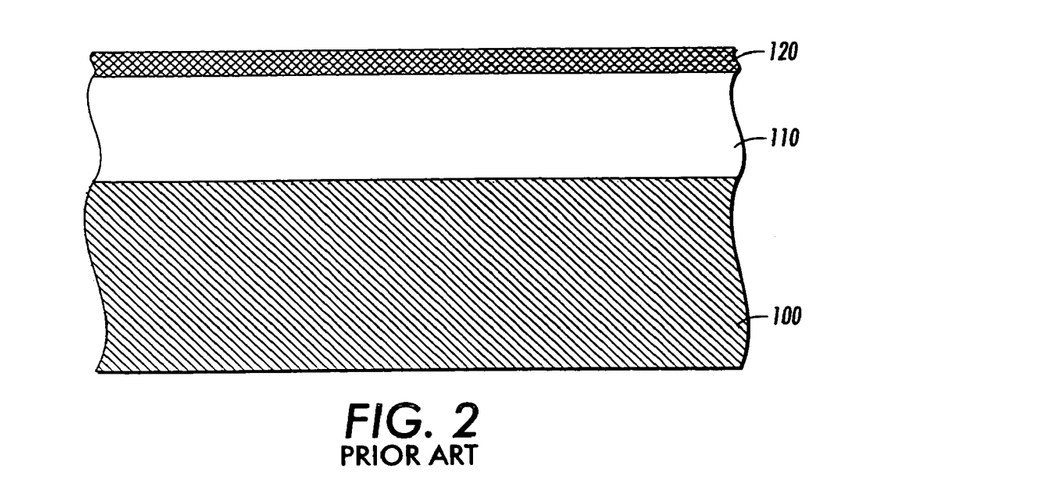
FIG. 2 represents a substrate having an ideal thin film layer formed on or over the substrate and a photoresist material layer formed over the thin film.

FIG. 2 shows a substrate 100 having a thin film layer 110 and a photoresist layer 120 formed according to steps S200, S300 and S400. Ideally, the thin film layer 110 would have no voids, cracks or other surface defects, as shown in FIG. 2. However, when a thin film layer such as thin film layer 110 is deposited upon a substrate, such as the substrate 100, voids, cracks or other surface defects typically occur in the thin film layer 110. The thin film layer 110 may be one of an oxide and a metallic salt, although it should be appreciated that other materials may be used to form the thin film layer 110 as well. For example, the oxide may be zinc. An exemplary list of other materials the thin film layer 110 may be formed of includes nitrides, sulfides, selenides, tellurides, arsenides, phosphides, borides, bromides, carbides, chlorides, cyanides, disulfides, fluorides, hydroxides, iodides, monoxides, oxyfluorides, oxynitrides, pentoxides, peroxides, titanides, aluminates, antimonides, silicates, silicides, stannates, titanates, and tungstates. Of course, it should be appreciated that any other known or later-developed material may also be used in the thin film layer 110.

Figure 3:
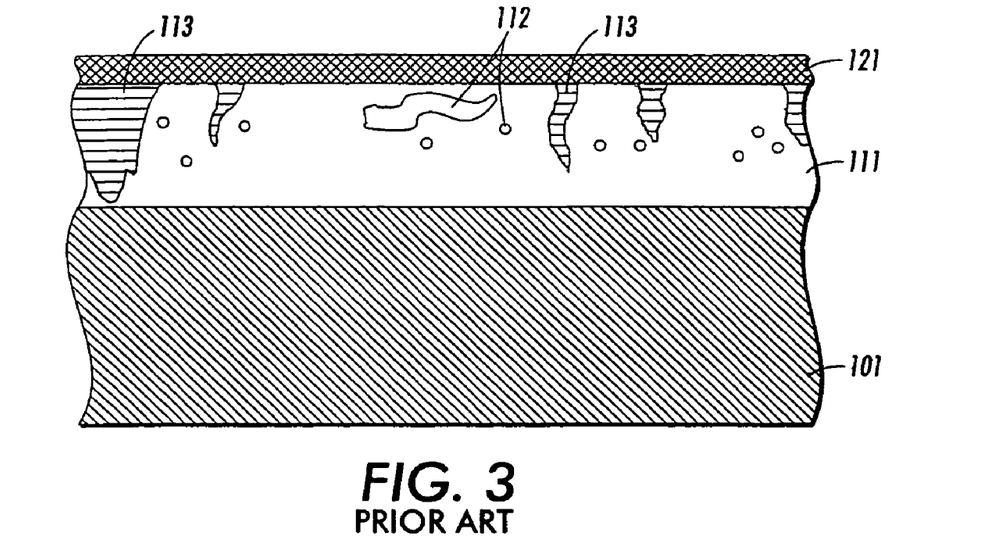
FIG. 3 illustrates a substrate having a thin film layer on the substrate and a photoresist material layer that has seeped into cracks or other surface defects of the thin film layer.

FIG. 3 shows a thin film layer 111 on a substrate 101, where the thin film layer 111 exhibits a variety of voids 112, and cracks or other surface defects 113. As a result of the cracks or other surface defects 113, the photoresist material layer 121, when applied, seeps into the cracks or other surface defects 113.

Figure 4:
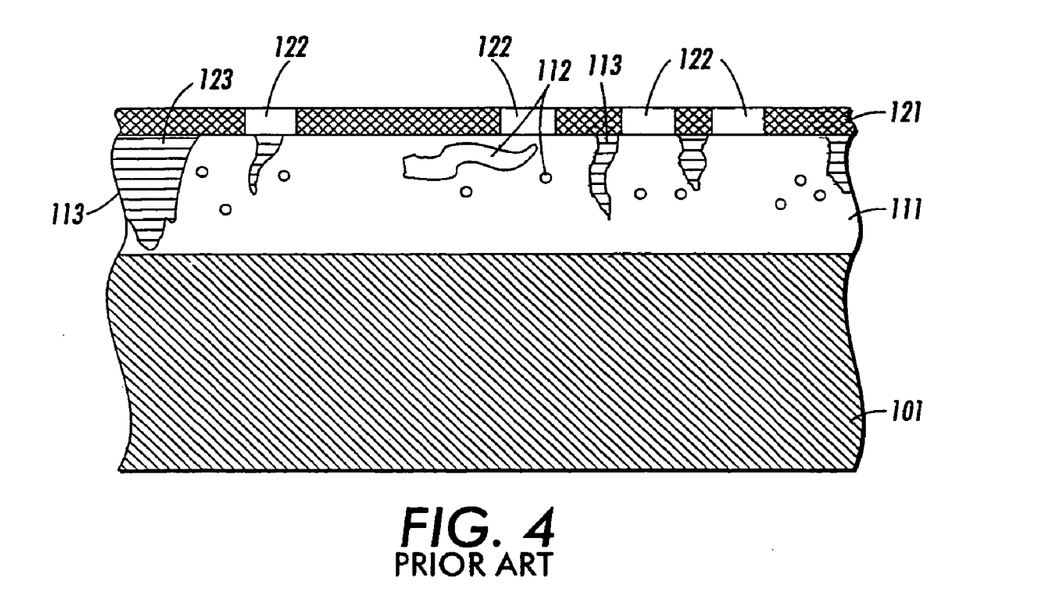
FIG. 4 illustrates the photoresist material layer of FIG. 3 after exposing the photoresist layer through a mask.

FIG. 4 shows the result of masking and developing the photoresist material layer 121 according to steps S500 and S600 of FIG. 1. Specifically, as shown in FIG. 4, after masking and developing the photoresist material layer 121, portions of the photoresist material layer 121 are removed, or washed away, except in those areas 122 where it is desired to continue to cover and protect the thin film layer 111. However, in addition to the photoresist remaining in the protection areas 122, where the photoresist material is intended or desired to remain, to protect the corresponding areas of the thin film layer 111, some photoresist material also remains in other, desirably-unprotected, areas of the thin film layer 111, such as in the cracks or other surface defects 113. This occurs because masking and developing the photoresist material layer 121 typically removes only those parts of the photoresist material layer 121 that are on the surface of the thin film layer 111. As a result, the remaining portions 123 of the photoresist material located in the cracks and other surface defects 113 of the thin film layer 111 pose problems when the etchant is applied, as described above with respect to step S600 of FIG. 1.

Figure 5:
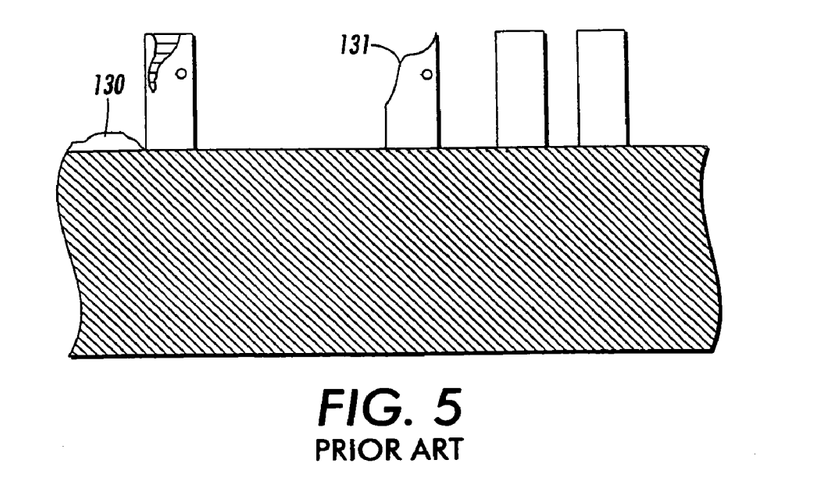
FIG. 5 illustrates the thin film layer of FIG. 4 after the etching and removal of the patterned photoresist layer.

However, as can be readily seen from FIG. 5, applying an etchant to a thin film layer 111 having cracks or other surface defects 113 filled with the remaining portions 123 of the photoresist material layer 121 results in not all of the thin film layer 111 being removed where it was desired that all of the thin film layer 111 be removed. The photoresist material interferes with or contaminates the etching process when the photoresist material contaminates the voids or other surfaces defects 113 in the thin film layer 111. Thus, undesirable thin film portions 130 remain on the substrate 100 even after etching. Moreover, the voids 112 permit unpredictable etching to occur underneath the protection portions 122 of the patterned photoresist material layer 121. Such unpredictable etching may result in, for example, the removal of a portion of the thin film layer 111 that was intended to remain after etching. This occurs as the etchant penetrates under or around a location such that the void 112 is located. As a result, an etched portion 131 of the film 111 may occur such that a portion of the thin film layer 111 that was intended to be fully present is missing.

Figure 6:
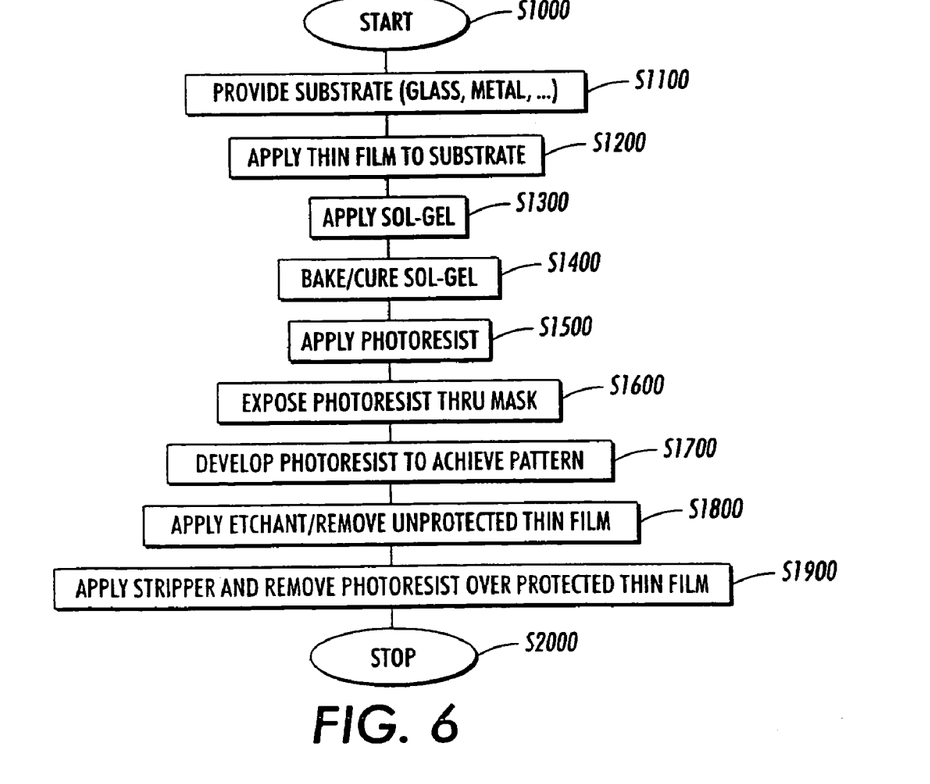
FIG. 6 is a flowchart outlining one exemplary embodiment of a method for forming a thin film layer on or over a substrate according to the systems and methods of this invention.

FIG. 6 is a flowchart outlining a first exemplary embodiment of a method for forming a thin film on a substrate according to this invention. The thin film contemplated is a porous thin film that poses the problems and disadvantages illustrated above with respect to FIGS. 1–5, particularly the unpredictable etching resulting in the removal of portions of the thin film layer that were intended to remain, and portions of the thin film layer that were intended to be removed remaining after etching the thin film. Reducing the porosity defects in porous thin films according to this invention improves the quality and accuracy of the patterned thin films produced.

As shown in FIG. 6, beginning in step S1000, operation continues to step S1100, where a substrate is provided. The substrate may be, for example, glass, metal, or other material known or later developed that is suitably appropriate to the application the thin film is to be used with. Then, in step S1200, a thin film layer is applied on or over the substrate. Next, in step S1300, a sol-gel layer is applied on the thin film layer. Generally, the sol-gel layer, or a precursor of the sol-gel material, is applied in liquid form and converted by post application processing, such as by baking or curing, to the thin film layer. Applying the sol-gel layer thus differs from forming the thin films represented in FIGS. 1–5 and permits a reduction of the porosity defects in the thin film layer to be obtained. Operation then continues to step S1400.

In step S1400, the sol-gel layer is cured, by baking or any other appropriate known or later developed curing techniques, to substantially merge and unify the sol-gel layer with the underlying thin film layer. Next, in step S1500, a photoresist material layer is applied over the top of the combined sol-gel/thin film layer. Then, in step S1600, the photoresist material layer is patterned using any appropriate known or later-developed patterning technique such as exposing the photoresist material through a mask. Operation then continues to step S1700.

In step S1700, the photoresist material layer is developed to produce a desired pattern in the photoresist material layer over the combined sol-gel/thin film layer. Then, in step S1800, an etchant is applied to remove the combined sol-gel/thin film layer, except in those areas where the photoresist material layer remains to protect the combined sol-gel/thin film layer. Subsequently, in step S1900, a stripper is used to remove the protection portions of the photoresist material layer to yield the patterned thin film with improved accuracy and minimal porosity defects. Next, in step S2000, the method ends.

Figure 7:
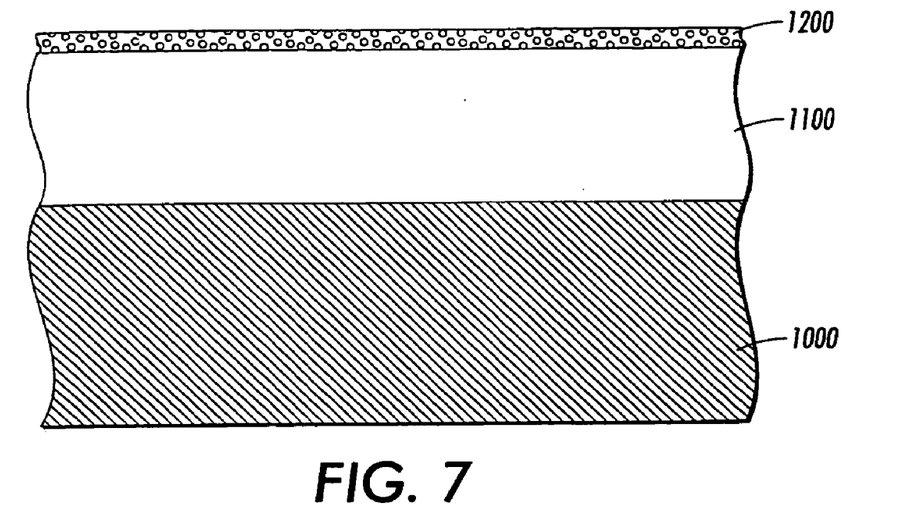
FIG. 7 illustrates a substrate having a thin film formed on or over the substrate and a sol-gel layer formed on the thin film layer.

FIG. 7 illustrates a substrate 1000 having a thin film layer 1100 on or over the substrate 1000 and a sol-gel layer 1200 formed on the thin film layer 1100. Ideally, as shown in FIG. 7, the thin film layer 1100 has no voids, crack or other surface defects. Thus, the sol-gel layer 1200 lies flat atop the upper surface of the thin film layer 1100. However, thin film layers deposited, or otherwise formed, on a substrate typically have voids and other defects due to their porous nature. The thin film layers may include an oxide and a metallic salt, but other materials may be used to form the thin film layer. The metallic salt may include zinc. The sol-gel material may include at least one of used to form thin film layers includes nitrides, sulfides, antimonides, arsenides, borides, bromides, carbides, chlorides, cyanides, disulfides, fluorides, hydroxides, iodides, monoxides, oxyfluorides, oxynitrides, pentoxides, peroxides, phosphides, selenides, tellurides, titanides, aluminates, silicates, stannates, titanates and tungstates.

Figure 8:
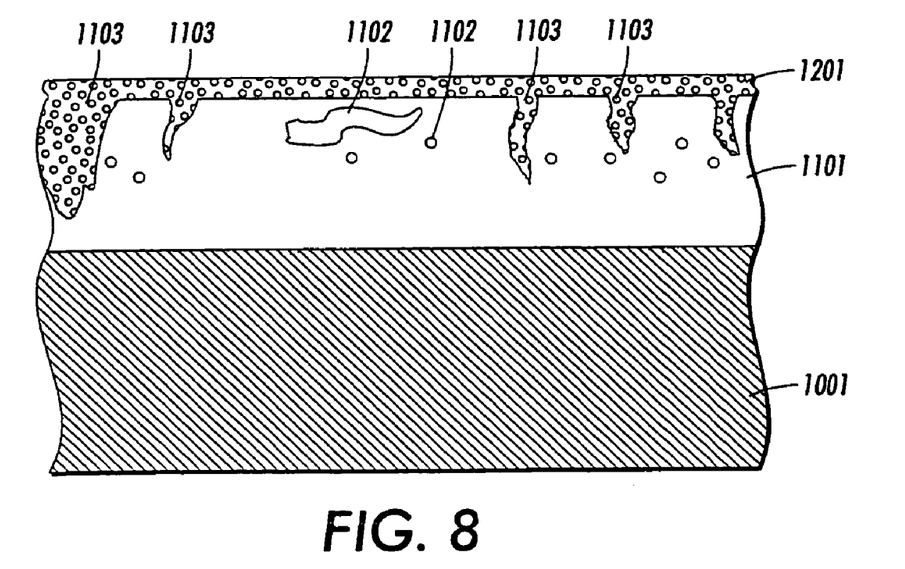
FIG. 8 illustrates the sol-gel layer seeping into and filling cracks and/or surface defects in the thin film layer.

FIG. 8 shows a substrate 1001 with a more typical porous thin film layer 1101 in which a number of voids 1102, and a number of cracks or other surface defects 1103 are present. FIG. 8 also shows that in such thin films 1101, the sol-gel layer 1201, applied on or over the upper surface of the porous thin film layer 1101, seeps into and fills the cracks or other surface defects 1103 present in the porous thin film layer 1101.

Figure 9:
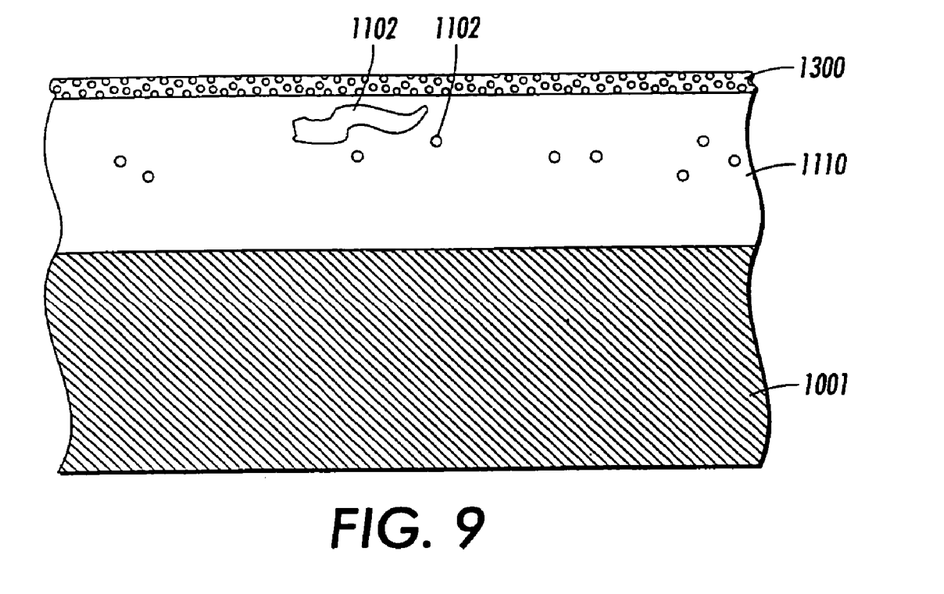
FIG. 9 illustrates a photoresist material layer applied on top of the combined sol-gel/thin film layer after the sol-gel has been cured.

FIG. 9 shows the substrate 1001 after the sol-gel layer 1201 and the thin film layer 1101 have been cured and merged to form a combined sol-gel/thin film layer 1110. The combined sol-gel/thin film layer 1110 exhibits substantially similar properties to that which were originally associated with the porous thin film layer 1101. A photoresist material layer 1300 is placed on or over the surface of the combined sol-gel/thin film layer 1110. As a result of the combined sol-gel/thin film layer 1110, masking and etching become more reliable as the combined sol-gel/thin film layer 1110 is patterned. Further, the physical properties of the combined sol-gel/thin film layer become substantially the same as the original thin-film-only layer. Thus, the sol-gel/thin film layer has a co-efficient of thermal expansion substantially the same as that of the thin-film-only layer. Similarly, the etch rate and velocity of sound transmissions for the sol-gel/thin film layer is substantially similar to the original thin-film-only layer.

Figure 10:
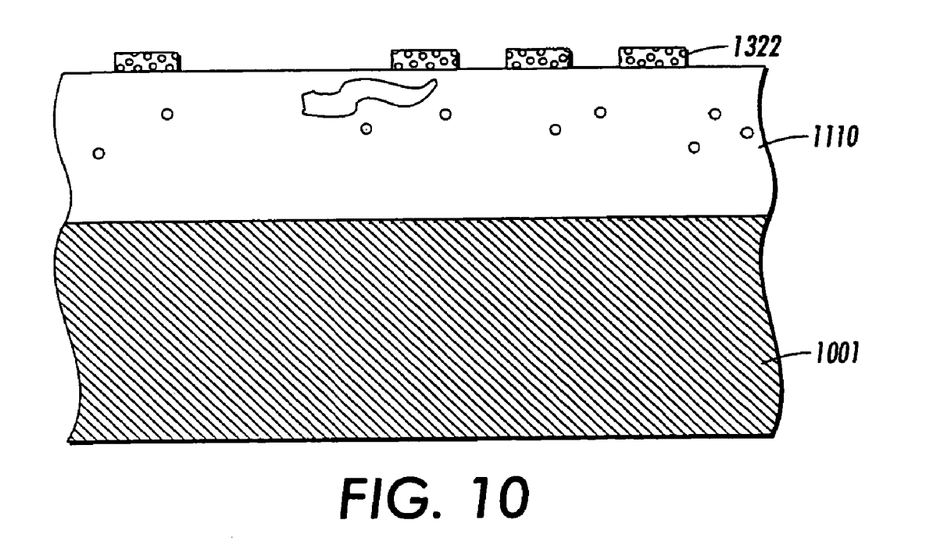
FIG. 10 illustrates the photoresist material layer of FIG. 9 after exposing and developing the photoresist layer through a mask.

As can be seen from FIG. 10, the combined sol-gel/thin film layer 1110 presents a smooth, generally defect-free (or at least defect-reduced) upper surface. Thus, the portions of the photoresist material layer 1300 that are to be removed can be removed accurately, so that only the protection portions 1322 of the patterned photoresist material layer 1300 remain. This patterning accuracy improves the accuracy in etching away only the unwanted portions of the combined sol-gel/thin film layer 1110.

Figure 11:
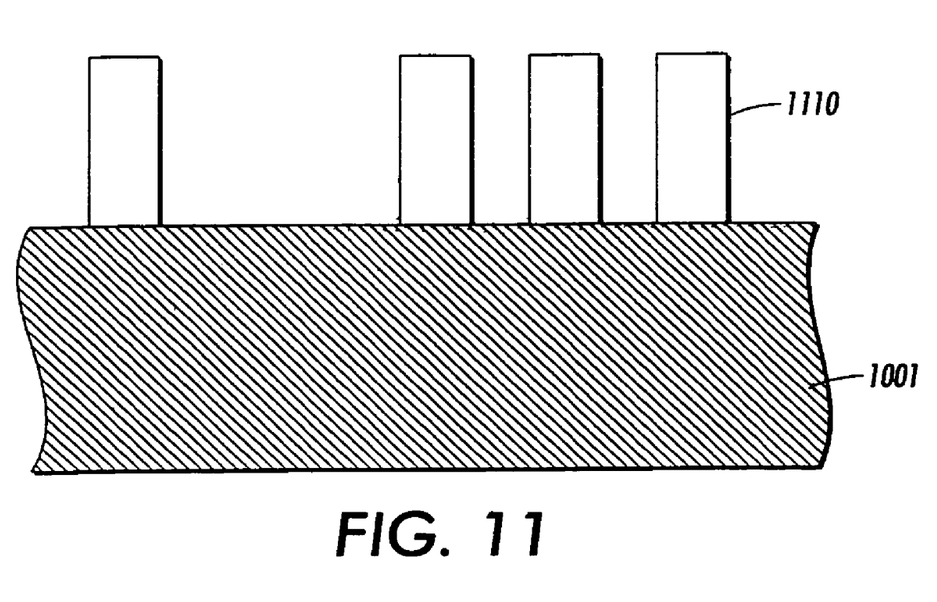
FIG. 11 illustrates the combined sol-gel/thin film layer of FIG. 10 according to the systems and methods of this invention after etching and removal of the patterned photoresist layer.

FIG. 11 illustrates the patterned combined sol-gel/thin film layer 1110 remaining after etching. As shown in FIG. 11, a reduced number of, and ideally no, remaining portions of combined sol-gel/thin film layer 1110 exist on top of the substrate 1001 other than those areas of the combined sol-gel/thin film layer 1110 that were under the protection portions 1322 of the patterned photoresist layer 1300. Likewise, the unpredictable surfaces that occurred as a result of etchant seepage underneath or around voids present in the combined sol-gel/thin film layer are reduced and ideally eliminated. Accordingly, more accurate thin film patterning and etching of the combined sol-gel/thin film layer 1110 is achieved. Likewise, because curing the sol-gel in step S1400 renders the combined sol-gel/thin film layer 1110 substantially the same as the initially-provided porous thin film layer 1101 alone, the desired properties of the thin film device are generally obtained. As a result, according to the systems and methods of this invention, a more reliable and more accurate thin film device is achieved at minimal expense.

It should be appreciated that in some embodiments, steps S1500–S1900 can be omitted if further processing of the sol-gel/thin film layer 1110 is not necessary or desirable, or that other processing in addition to, or instead of, photoresist patterning is to performed on the sol-gel/thin film layer 1110. This may be especially so where an additional layer, different than, or to the exclusion of, the photoresist material layer is applied on or over the combined sol-gel/thin film layer 1110. Such a combinant sol-gel/thin film layer has a reduced number of porosity defects as compared to the original untreated thin film layer, so that a subsequent layer, or layers, other than photolithography/photoresist materials may be applied to the sol-gel/thin film layer 1110 without the risks a high number of porosity defects would otherwise pose. Accordingly, increased stability, strength and structural integrity may be advantageously achieved in any device having a sol-gel/thin film layer to reduce porosity defects otherwise present in an untreated thin film.

Further, it should be appreciated that in still other embodiments, the steps S1500–S1900 may be omitted after the sol-gel/thin film layer 1110 is formed so that further processing other than, or in combination with, etching may occur with advantages of the reduced porosity defects resulting form the sol-gel/thin layer 1110. Other exemplary benefits and/or advantages of the combined sol-gel thin film layer having reduced porosity defects include an increased mechanical integrity of the sol-gel/thin film layer. As a result, more uniform strength or stability exists in the sol-gel/thin film layer, rendering wire bonding, for example, more reliable. Further, the uniformity of the sol-gel/thin film layer creates a medium having substantially the same velocity of sound which improves the transmission reliability of acoustic sound waves in the sol-gel/thin film layer. Photoresist intrusions and/or lateral etchant intrusion are also reduced due to applying the sol-gel layer on the thin film layer. Other benefits and advantages may also result from the sol-gel thin film layer of the invention.

While this invention has been described in conjunction with the specific embodiments above, it is evident that many alternatives, combinations, modifications, and variations are apparent to those skilled in the art. Accordingly, the preferred embodiments of this invention, as set forth above are intended to be illustrative, and not limiting. Various changes can be made without departing from the spirit and scope of this invention.

What is claimed is:

1. A method of reducing the effects of surface penetrating defects in a substrate having a thin film, comprising:
   providing a glass substrate;
   applying a thin film on or over the glass substrate;
   applying a sol-gel layer on or over the thin film, the sol-gel layer seeping into the thin film and filling at least some voids, cracks or other surface penetrating defects present in the thin film; and
   curing the sol-gel layer to combine the sol-gel layer and the thin film layer into a sol-gel/thin film layer having reduced porosity and surface penetrating defects;
   wherein curing the sol-gel yields the sol-gel/thin film layer that exhibits an etch rate that is substantially the same as the corresponding property in the thin film layer prior to applying the sol-gel layer;
   applying a photoresist material layer to the sol-gel/thin-film layer;
   exposing the photoresist material layer through a mask;
   developing the photoresist material layer to achieve a pattern of protected portions of the sol-gel thin film layer;
   applying an etchant to remove unprotected portions of the sol-gel/thin film layer; and removing the photoresist material layer remaining over the protected portions of the sol-gel/thin film layer.

2. The method of claim 1, wherein the sol-gel is a liquid.

3. The method of claim 1, wherein curing the sol-gel yields the sol-gel/thin film layer that exhibits at least one additional property that is substantially the same as the corresponding property in the thin film layer prior to applying the sol-gel layer.

4. The method of claim 3, wherein the at least one additional property is a coefficient of thermal expansion.

5. The method of claim 4, wherein the sol-gel/thin film layer further exhibits an increased mechanical strength.

6. The method of claim 4, wherein the at least one property includes, in addition, a substantially uniform medium for transmitting acoustic waves.

* * * * *